(12) United States Patent
Diffenderfer

(10) Patent No.: US 8,395,411 B2
(45) Date of Patent: Mar. 12, 2013

(54) CONSTANT IMPEDANCE LINE DRIVER WITH DIGITALLY CONTROLLED EDGE RATE

(75) Inventor: Jan C. Diffenderfer, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/901,282

(22) Filed: Oct. 8, 2010

(65) Prior Publication Data

US 2012/0086470 A1 Apr. 12, 2012

(51) Int. Cl.
*H03K 19/003* (2006.01)
(52) U.S. Cl. ............ 326/30; 326/87; 327/109; 327/112; 327/170
(58) Field of Classification Search ............ 326/30, 326/82–83, 86–87; 327/108–109, 112, 170
See application file for complete search history.

(56) References Cited

U.S. PATENT DOCUMENTS

| | | | | |
|---|---|---|---|---|
| 5,111,075 | A * | 5/1992 | Ferry et al. | 326/27 |
| 5,739,707 | A * | 4/1998 | Barraclough | 327/112 |
| 5,859,552 | A * | 1/1999 | Do et al. | 327/170 |
| 6,452,428 | B1 | 9/2002 | Mooney et al. | |
| 6,636,821 | B2 | 10/2003 | Lawson | |
| 6,704,818 | B1 * | 3/2004 | Martin et al. | 710/100 |
| 6,744,287 | B2 * | 6/2004 | Mooney et al. | 327/108 |
| 6,864,726 | B2 * | 3/2005 | Levin et al. | 327/112 |
| 7,095,348 | B1 * | 8/2006 | Sutardja et al. | 341/144 |
| 7,187,197 | B2 | 3/2007 | Tripathi et al. | |
| 7,202,702 | B2 * | 4/2007 | Arnold et al. | 326/87 |
| 7,253,656 | B2 | 8/2007 | Costa et al. | |
| 7,795,942 | B2 * | 9/2010 | Quan et al. | 327/261 |
| 2004/0164763 | A1 | 8/2004 | Kim et al. | |
| 2005/0127967 | A1 | 6/2005 | Allen | |
| 2007/0001725 | A1 * | 1/2007 | Atha et al. | 327/172 |
| 2007/0103186 | A1 * | 5/2007 | Clements et al. | 326/30 |
| 2007/0210832 | A1 * | 9/2007 | Abel et al. | 326/93 |
| 2008/0079458 | A1 | 4/2008 | Shin et al. | |

FOREIGN PATENT DOCUMENTS

FR 2863790 6/2005

OTHER PUBLICATIONS

International Search Report and Written Opinion—PCT/US2011/054976—ISA/KIPO—Nov. 17, 2011.

* cited by examiner

*Primary Examiner* — Jason M Crawford
(74) *Attorney, Agent, or Firm* — Knobbe Martens Olson & Bear, LLP

(57) ABSTRACT

A constant impedance driver provides controlled output slew rates. The driver includes a plurality of buffers, each with an output impedance that is multiple of the output impedance of the driver. Outputs of buffers are coupled in parallel to form the output of the driver. Inputs to the buffers are coupled to an input signal or delayed versions of the input signal. The buffer inputs may be selectively coupled to taps of a delay line to provide selected slew rates on the output of the driver. The buffers may be selectively enabled to change or calibrate the output impedance of the driver.

20 Claims, 5 Drawing Sheets

CONSTANT IMPEDANCE LINE DRIVER WITH DIGITALLY CONTROLLED EDGE RATE

BACKGROUND OF THE INVENTION

The present invention relates generally to driver circuitry, and more particularly to a line driver providing an output signal for an integrated circuit.

Integrated circuits often provide signals to other integrated circuits. Transmission of signals between integrated circuits, however, may be problematic. Signal reflections, due for example to impedance mismatches, may result in undesirable noise, which may result in improper recovery of data by the receiving circuit. In addition, integrated circuits may be designed such that characteristics of received signals, in terms of slew rates, signal strength, and other characteristics, are required to be within predefined bounds. Unfortunately, factors such as transmission line length, receiving circuitry characteristics, or other factors, may impose varying loads on transmission circuitry, causing undesirable variations in signal quality and strength of received signals.

BRIEF SUMMARY OF THE INVENTION

One aspect of the invention provides a constant impedance line driver with controlled output slew rate. Another aspect of the invention provides a constant impedance line driver with a digitally controlled output slew rate.

In some aspects the invention provides a constant impedance driver, including: delay circuitry configured to produce a plurality of signals each delayed different amounts with respect to an input signal; and a plurality of buffers, each buffer configured to receive as an input one of signals of the input signal and the plurality of signals and to drive an output with a first impedance, with outputs of the plurality of buffers commonly coupled to provide a driver output.

In some aspects the invention provides a constant impedance driver, including: delay circuitry configured to produce a first plurality of signals each delayed different amounts with respect to an input signal; selection circuitry configured to produce a second plurality of signals, each signal of the second plurality of signals a selected one of the first plurality of signals; and a plurality of buffers, each buffer configured to receive one of signals of the input signal and the second plurality of signals as an input and drive an output with a first impedance, with outputs of the plurality of buffers commonly coupled to provide a driver output.

In some aspects the invention provides a method of producing a controlled slew rate output signal, the method including: delaying an input signal to produce a first plurality of signals each delayed differently with respect to the input signal; selecting signals from the first plurality of signals; and buffering the selected signals and the input signal with a plurality of buffers, each buffer driving an output with a first impedance and the outputs of the plurality of buffers commonly coupled to provide the controlled slew rate output signal.

These and other aspects of the invention are more fully comprehended upon review of this disclosure.

DETAILED DESCRIPTION

Figure 1:
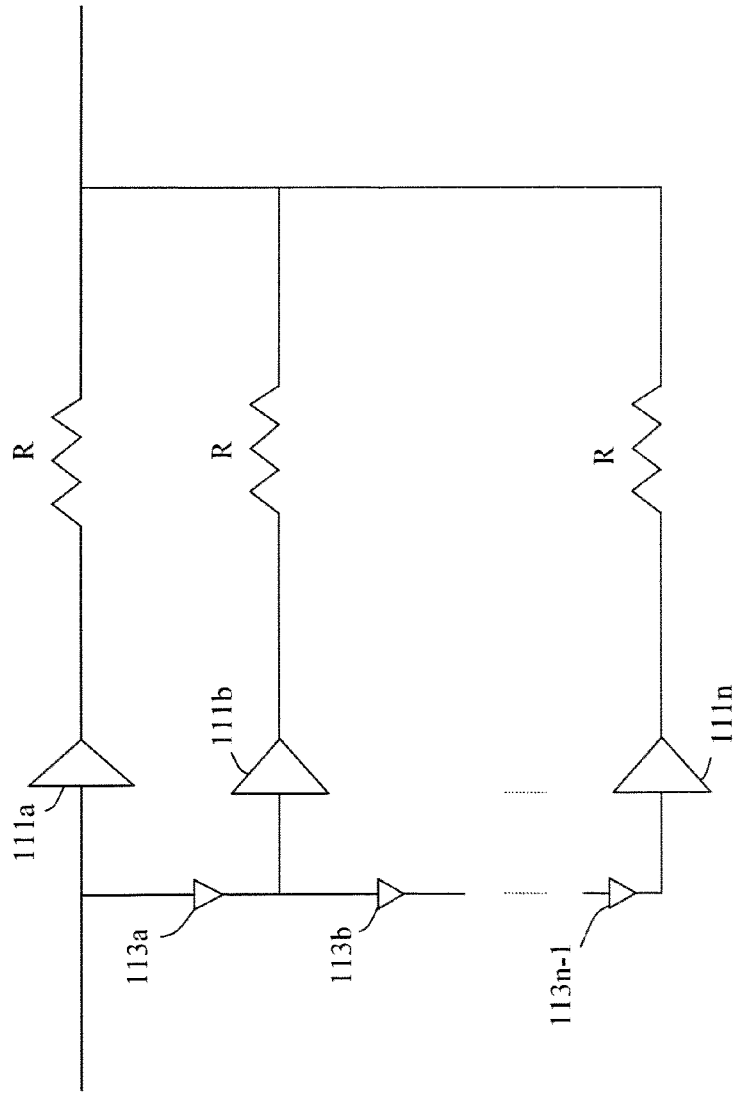
FIG. 1 is a semi-schematic of a driver in accordance with aspects of the invention.

FIG. 1 is a semi-schematic of a driver in accordance with aspects of the invention. The driver includes an array of buffers 111a-n. Each of the buffers is coupled to an output line by a corresponding resistance R. Each buffer and its corresponding resistance are in parallel to one another. When the output impedance of the buffers is negligible compared to the resistance R, the output impedance of the driver is R/n, for the case with n buffers. When the output impedance of the buffers is not negligible compared to the resistance R, the output impedance of the driver is more accurately stated as (Zout+R)/n, where Zout is the output impedance of the buffers, R and n may be selected, for example, such that the driver may have a particular desired output impedance. For example, if an output impedance of 150 ohms is desired, three buffers may be used, with n=3, and a resistance of 450 ohms may be used in series with outputs of each buffer.

A first of the buffers of the array of buffers is coupled to an input signal line, with the first of the buffers receiving a signal on the input signal line as an input. The remaining buffers of the array of buffers also receive a signal on the input signal line, with, however, the signal delayed differently for each buffer. Delay of the signal may be provided by a series of delay elements 113a-113n-1. The delay elements may be provided as a delay line. The delay elements may include digital circuitry, for example, inverter chains. The delay elements may also include analog circuitry, for example, amplifiers with controlled-currents. Accordingly, the input signal line is also coupled to the series of delay elements 113a-113n-1. Outputs of different ones of the delay elements are coupled to inputs of different ones of the buffers. Preferably delay provided by the series of delay elements, individually and in total, is much smaller than a clock period associated with signal transitions of signals on the input signal line.

In operation, a voltage transition in the signal on the input signal line results in a corresponding voltage transition in the output of the first buffer, after a slight delay due to operation of the buffer. The output of the second buffer will also exhibit a corresponding transition, but the transition in the output voltage of the second buffer will be further delayed by any delay elements, one delay element as shown in FIG. 1, between the input signal line and the input of the second buffer. Similarly, the output of the nth buffer will also exhibit a corresponding transition, but again will be further delayed by any delay elements, n−1 delay elements as shown in FIG. 1, between the input signal line and the input of the nth buffer.

Consideration of the Thevenin equivalent circuit of the driver shows that the output impedance of the driver is substantially constant regardless of the value of the output signal, including during transitions in the output signal. Each buffer and resistance pair may be modeled with a Thevenin equivalent circuit having a resistance of R and source voltage depending on the output signal level of the buffer. Accordingly, the Thevenin equivalent circuit of the driver with n buffers has a resistance of R/n and a source voltage of h/n, where the output range is normalized to zero to one and h is the number of buffers driving a one level. In some embodiments, the buffers may be disabled to switch the output impedance of the driver to a high impedance.

As outputs of the different buffers transition at different times, the output of the driver as a whole transitions over a greater length of time than would otherwise occur without the presence of the delay elements, and therefore exhibits a decreased slew rate than would otherwise occur. The slew rate of the output of the driver is largely controlled by the delay elements rather than characteristics of the buffers or a load on the output. Through selection of number of delay elements and/or length of delay of delay elements, a particular slew rate may be provided for the driver output.

Figure 2:
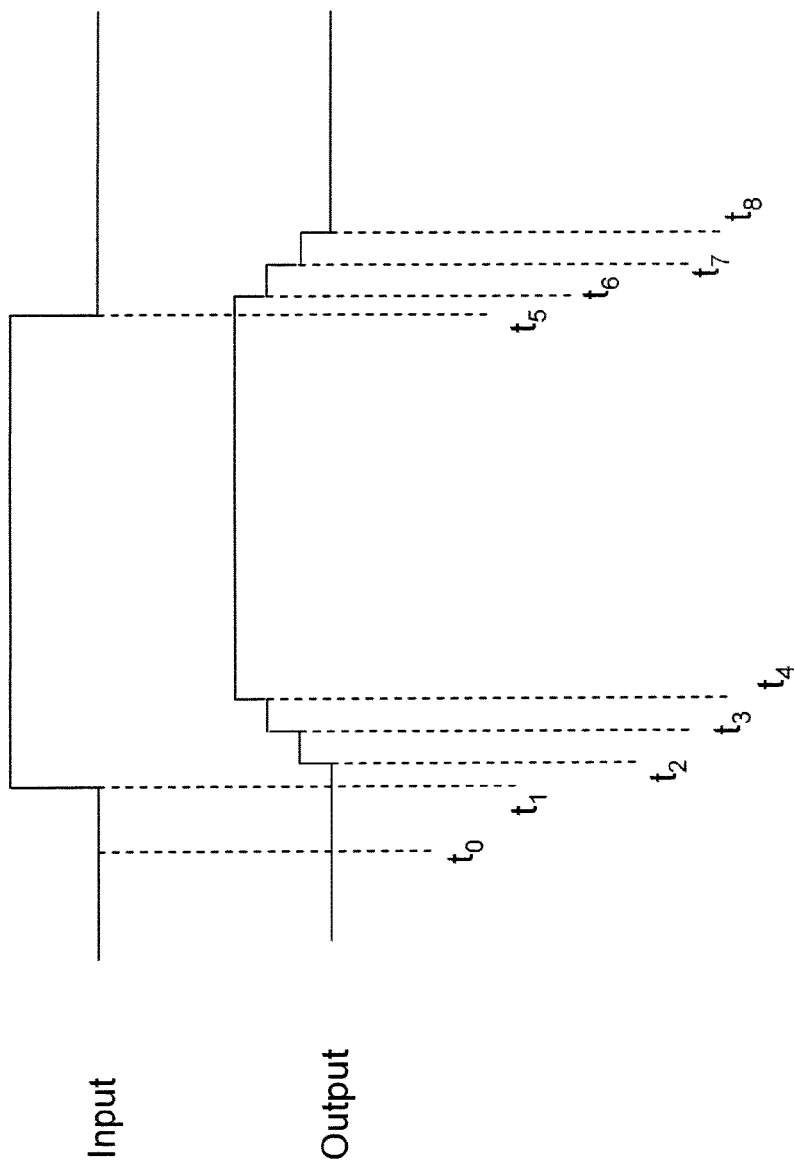
FIG. 2 is a timing diagram showing operation of an embodiment of the driver of FIG. 1.

FIG. 2 is a timing diagram showing idealized operation of the driver of FIG. 1 for the case where n=3, namely the driver utilizes three buffers. Operation of a driver with three buffers is shown for ease of illustration and an embodiment may have many more buffers, for example, twenty. At time t0, an input signal and an output signal are both at 0 (with input voltage and output voltage both normalized to a range from 0 to 1). At time t1, the input signal transitions to 1. At time t2, which is t1 plus delay due to operation of a first buffer, the output voltage transitions to ⅓. At time t3, which is t1 plus delay through a first delay element plus delay due to operation of a second buffer, the output voltage transitions to ⅔. At time t4, which is t1 plus delays through the first delay element and the second delay element plus delay due to operation of a third buffer, the output voltage transitions to 1.

At time t5, the input signal transitions to 0. At time t6, which is t5 plus delay due to operation of a first buffer, the output voltage transitions to ⅔. At time t7, which is t5 plus delay through a first delay element plus delay due to operation of a second buffer, the output voltage transitions to ⅓. At time t8, which is t5 plus delays through the first delay element and the second delay element plus delay due to operation of a third buffer, the output voltage transitions to 0.

Transitions in the idealized output signal therefore proceed in a stair step manner. In actual operation, however, transitions in the output signal do not occur in a stair step manner, as some slew rate is associated with operation of each of the buffers. Additionally, any capacitance on the output, in combination with the output impedance of the buffer, will reduce the output slew rate. Accordingly, the output signal will generally exhibit, in many embodiments, a smooth transition from a 0 level to a 1 level and vice versa.

Figure 3:
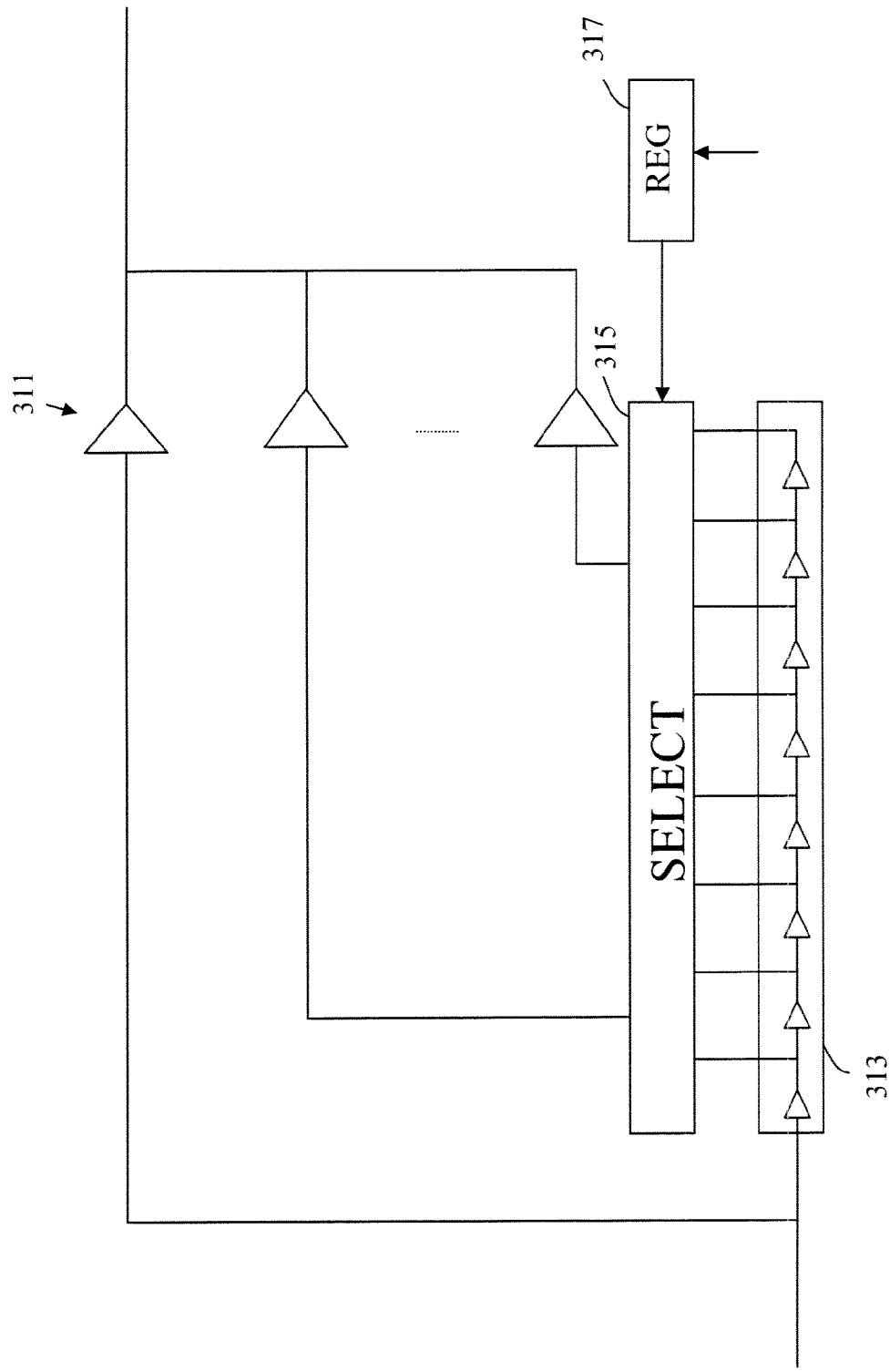
FIG. 3 is a semi-schematic of a further driver in accordance with aspects of the invention.

FIG. 3 is a semi-schematic of a further driver in accordance with aspects of the invention. The further driver includes an array of buffers 311. Each of the buffers has an output impedance Z=R, and the buffers are coupled in parallel to an output line. In some embodiments a resistance is in series with outputs of each of the buffers, with the resistance providing at least part of the output impedance, and the buffer and the resistance together considered the buffer. In other embodiments the resistance, however, is internal to the buffer.

An input signal for the buffers is provided to a first buffer of the array of buffers and a tapped delay line 313. The tapped delay line includes, for example, a series of delay elements, with outputs or taps taken between delay elements. The delay elements may themselves be buffers, or other circuit elements. In some embodiments, the delay elements are part of a delay locked loop (DLL) with the delay of each of the delay elements adjusted, for example, to be proportional to a clock period. The delay elements may additionally have different delays for rising transitions than for falling transitions.

Signals from the taps are provided as inputs to selection circuitry 315. The selection circuitry passes signals on selected taps to the buffers, other than the first buffer as illustrated in FIG. 3. The selection circuitry may be implemented, for example, as a plurality of multiplexers, with one or more multiplexers being provided for each buffer. Also as illustrated in FIG. 3, selection of the taps is based on values in a register 317. The register may be set by way of a programming interface for a device including the driver, by way of setting selected pin values of the device including the driver to predetermined voltages, or in other manners, although selection of the taps may instead be based on feedback signals, inputs to a device including the driver, or otherwise.

Use of selectable taps is useful, for example, in allowing a common architecture to provide different ramp up and ramp down characteristics for transitions of the output voltage of the driver. The selected taps may be spaced non-uniformly to further shape transition of the output of the driver. For example, later delays could be spaced wider than early delays to avoid overshoot on the output signal.

Figure 4:
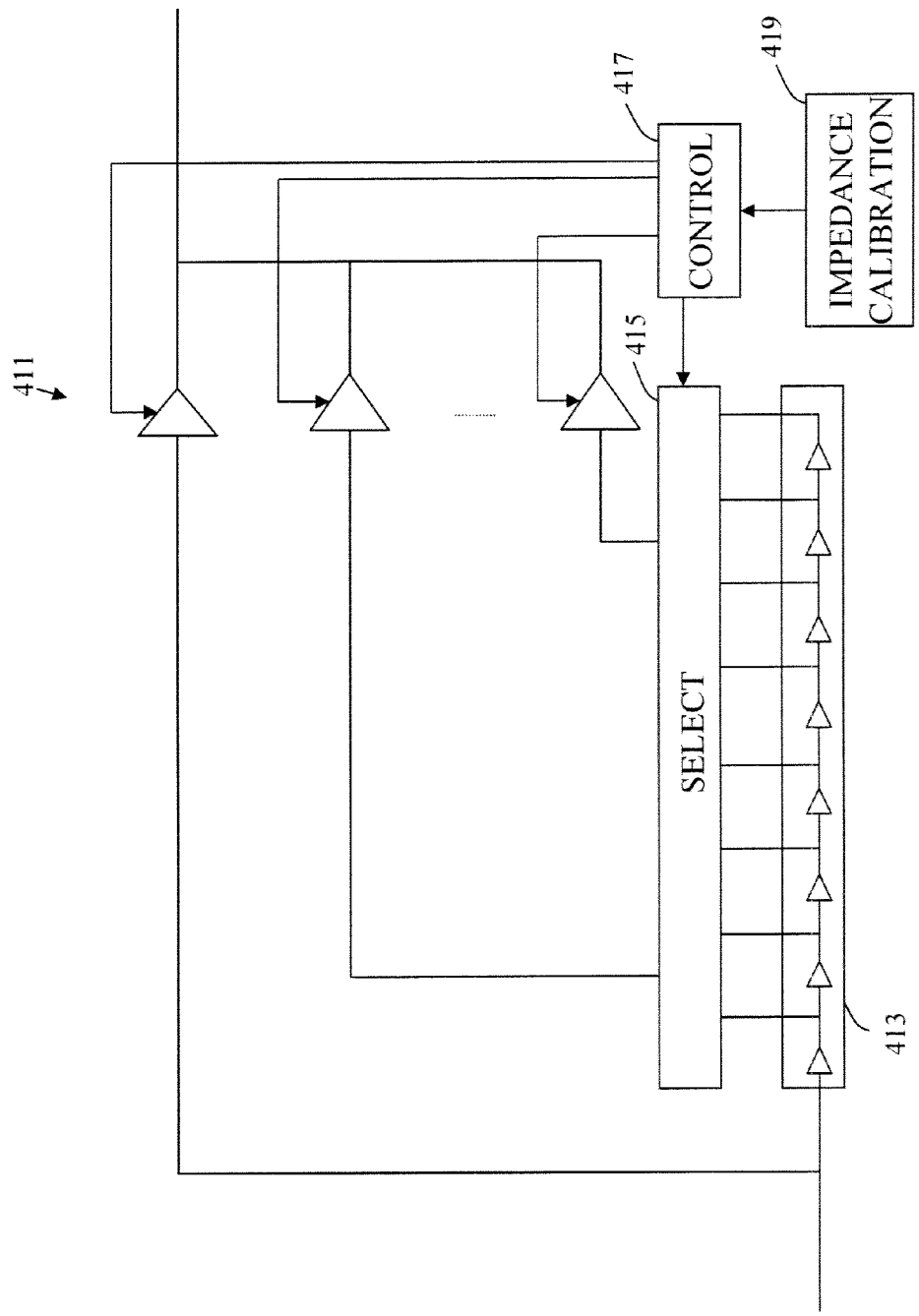
FIG. 4 is a semi-schematic of a further driver in accordance with aspects of the invention.

FIG. 4 is a semi-schematic of another driver in accordance with aspects of the invention. The driver includes an array of buffers 411. Each of the buffers receives an enable signal from control circuitry 417. When enabled, the buffer has an output impedance Z=R, and when disabled, the buffer has a much higher output impedance. The impedance of a disabled buffer may practically be considered infinite. The buffers are coupled in parallel to an output line, and the output impedance of the driver depends on the number of enabled buffers. Accordingly, by changing the number of enabled buffers, the output impedance of the driver may be changed. The output impedance of the driver is R/m, where R is the output impedance of the buffers and m is the number of enabled buffers. The driver may be disabled or switched to a high-impedance state by having none of the buffers enabled.

The output impedance of each buffer will generally be designed to have a nominal value. The actual value of the output impedance of the buffers may vary depending on manufacturing variations, operating temperature, or other effects. The output impedance of the driver is proportional to the output impedance of the buffers; thus, the output impedance of the driver may also vary depending on manufacturing variations, operating temperature, or other effects. Since the output impedance of the driver is inversely proportional to the number of enabled buffers, changing the number of enabled buffers may be used to compensate for changes in the output impedance of the buffers. When the number of enabled buffers is proportional to the actual value of the output impedance of the buffers, the output impedance of the driver is largely independent of manufacturing variations, operating temperature, or other effects that change the output impedance of the buffers.

Impedance calibration circuitry 419 supplies a signal to the control circuitry for use in determining how many of the buffers to enable. The signal supplied by the impedance calibration circuitry is indicative of the impedance of the buffers. In some embodiments, the value of the signal may be determined by measuring the impedance of one of the buffers or a scaled replica of the buffers. The accuracy of the output impedance of the driver in such embodiments varies with any mismatch between the impedance of each of the buffers to the measured one of the buffers or to the scaled replica of the buffers. If the mismatch is too large to provide sufficient accuracy to satisfy driver requirements, an embodiment may, for example, average measurements of multiple ones of the buffers to improve accuracy. In other embodiments, the value of the signal is determined by indirect measurements, for example, by the value of the sheet resistance of a material used to form resistances in the buffers. In other embodiments, the value of the signal is determined by a control loop that varies the number of enabled buffers until the output impedance of the driver has a desired output impedance. Such embodiments may reduce or eliminate inaccuracy in driver output impedance caused by changes in characteristics of the process used to manufacture the driver or by mismatch between buffers or between buffers and scaled replicas of the buffers.

The control circuitry uses the signal supplied by the impedance calibration circuitry to determine how many buffers to enable to provide a desired output impedance of the driver. For example, an embodiment of the driver may include 14 buffers with a nominal output impedance of 500 ohms and a desired driver output impedance of 50 ohms. Nominally, 10 buffers may be enabled. When the output impedance of the buffers is, for example, 600 ohms, 12 buffers may instead be enabled. Corresponding numbers of buffers may be enabled for other values of the output impedance of the buffers.

An input signal for the buffers is provided to a first buffer of the array of buffers and a tapped delay line 413. The tapped delay may be similar to or the same as the tapped delay of the embodiment of FIG. 3. Signals from taps of the tapped delay line are provided as inputs to the selection circuitry 415. The selection circuitry may be similar to or the same as the selection circuitry of the embodiment of FIG. 3. As illustrated in FIG. 4, selection of the taps is based on signals from the control circuitry. The control circuitry signals tap selection based on a desired slew rate of the driver and the number of buffers enabled. For example, when the desired slew rate uses a maximum delay corresponding to the third tap and five buffers are enabled to provide the desired output impedance, the control circuitry may signal the selection circuitry to provide a first buffer with the undelayed input signal, a second and third buffer with the signal from the first tap, a fourth buffer with the signal from the second tap, and a fifth buffer with the signal from the third tap.

Figure 5:
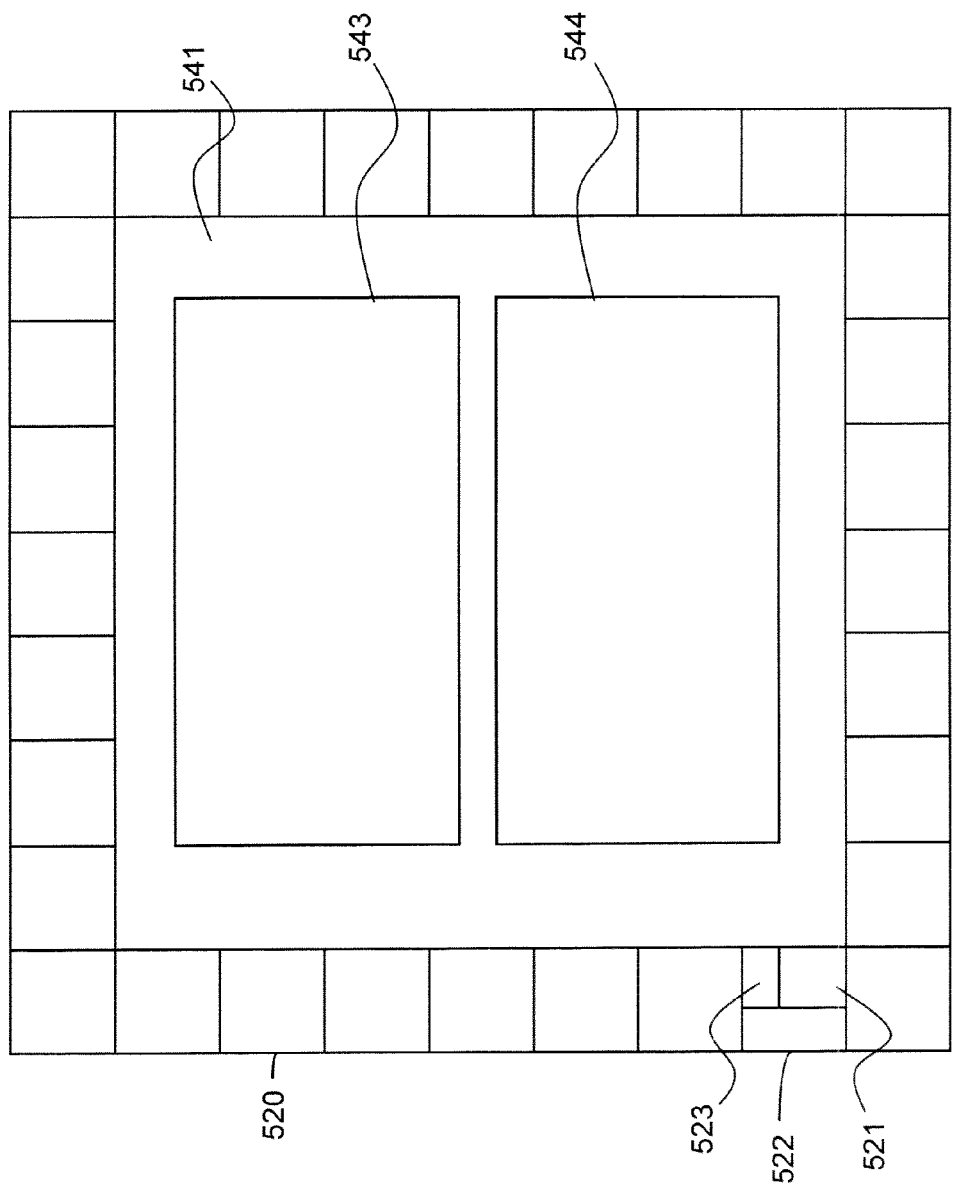
FIG. 5 is a block diagram of an integrated circuit die in accordance with aspects of the invention.

FIG. 5 is a block diagram of an integrated circuit die in accordance with aspects of the invention. The die includes a core portion 541 containing various blocks of circuitry. As illustrated in FIG. 5, the core portion may contain a memory block 543, for example, a random-access memory, and a logic block 544, for example, logic cells in a sea of transistors. The die also includes a periphery of I/O cells 520. Other embodiments may have a different arrangement of the core portion and I/O cells, for example, having an array of I/O cells located near a central axis of the core portion or having I/O cells generally distributed across the die.

One of the I/O cells is illustrated in more detail in FIG. 5. The I/O cell includes a driver 521. The driver drives an output with controlled impedance and edge rates. In various embodiments, the driver may be one of the drivers of FIG. 1, 3, or 4, and in some embodiments, the driver receives an input signal from the core portion or another I/O cell. The driver buffers the input signal to drive the output of the driver. The output of the driver may be coupled to a bonding pad 522 and thereby supplied to devices external to the die containing the driver. The output of the driver may be coupled by transmission line to another integrated circuit die, and the controlled impedance of the driver may approximately match the impedance of the transmission line. The I/O cell may also include an input buffer 523. The input buffer may receive a signal from the bonding pad and supply a buffered version of the signal to the core portion. Other I/O cells may include fewer, greater, of differing components. For example, an output-only I/O cell may include the driver but omit the input buffer.

Accordingly, aspects of the invention provide a constant impedance driver. Although the invention has been discussed with respect to various embodiments, it should be recognized that the invention comprises the novel and non-obvious claims supported by this disclosure.

The invention claimed is:

1. A constant impedance driver having a driver output for driving a signal from an integrated circuit, the constant impedance driver comprising:
   delay circuitry configured to produce a plurality of delayed signals each delayed different amounts with respect to an input signal; and
   a plurality of buffers, including a first buffer configured to receive as an input the non-delayed signal, and a second buffer configured to receive as input one of the plurality of delayed signals, the plurality of buffers configured to drive an output with a first impedance, with outputs of the plurality of buffers commonly coupled to provide the driver output; and
   calibration circuitry configured to enable selected ones of the plurality of buffers based on a measured indication of the first impedance,
   wherein each buffer of the plurality of buffers is further configured to have its output selectively enabled.

2. The constant impedance driver of claim 1, wherein each buffer of the plurality of buffers comprises a resistor configured to provide at least part of the first impedance.

3. The constant impedance driver of claim 1, further comprising selection circuitry configured to couple the delayed signals to inputs of the buffers.

4. The constant impedance driver of claim 1, wherein the delay circuitry comprises a delay-locked loop.

5. The constant impedance driver of claim 1, wherein the measured indication of the first impedance is determined by a control loop that varies the number of enabled buffers until a selected output impedance of the driver is reached.

6. The constant impedance driver of claim 1, wherein the measured indication of the first impedance is determine by measuring a scaled replica of the buffers.

7. A constant impedance driver having an output for driving a signal from an integrated circuit, the constant impedance driver comprising:
   delay circuitry configured to produce a first plurality of signals each delayed different amounts with respect to an input signal;
   selection circuitry configured to produce a first plurality of signals each delayed different amounts with respect to an input signal;
   a plurality of buffers, including a first buffer configured to receive as an input the non-delayed signal, and a second buffer configured to receive as input one of the plurality of delayed signals, the plurality of buffers configured to drive an output with a first impedance, with outputs of the plurality of buffers commonly coupled to provide the driver output, and wherein each buffer of the plurality of buffers is further configured to have its output selectively enabled; and
   calibration circuitry for use in enabling selected ones of the plurality of buffers based on a measured indication of the first impedance.

8. The constant impedance driver of claim 7, wherein each buffer of the plurality of buffers comprises a resistor configured to provide at least part of the first impedance.

9. The constant impedance driver of claim 7, wherein the delay circuitry comprises a delay-locked loop.

10. The constant impedance driver of claim 7, wherein the measured indication of the first impedance is determined by a control loop that varies the number of enabled buffers until a selected output impedance of the driver is reached.

11. The constant impedance driver of claim 7, wherein the measured indication of the first impedance is determine by measuring a scaled replica of the buffers.

12. A method of producing a controlled slew rate output signal, the method comprising:
    receiving an input signal at a first buffer without first delaying the input signal;
    delaying the input signal to produce a first plurality of delayed signals each delayed differently with respect to the input signal;
    selecting signals from the first plurality of delayed signals;
    buffering the delayed, selected signals with a plurality of additional buffers;
    selecting a quantity of buffers to enable among the first buffer and the plurality of different buffers in proportion to a measured indication of the first impedance and
    producing a driver output with a first impedance using the selected quantity of buffers among the first buffer and the plurality of different buffers,
    wherein the outputs of the first buffer and the plurality of different buffers are commonly coupled to provide the controlled slew rate output signal.

13. The method of claim 12, wherein the measured indication of the first impedance is determined by measuring the first impedance of one of the plurality of different buffers.

14. A non-transitory, computer-readable storage medium comprising instructions which, when executed by one or more processors, cause a computing device to perform a method of producing a controlled slew rate output signal, the method comprising:
    receiving an input signal at a first buffer without first delaying the input signal;
    delaying the input signal to produce a first plurality of delayed signals each delayed differently with respect to the input signal;
    selecting signals from the first plurality of delayed signals;
    buffering the delayed, selected signals with a plurality of additional buffers;
    selecting a quantity of buffers to enable among the first buffer and the plurality of different buffers in proportion to a measured indication of the first impedance and
    producing a driver output with a first impedance using the selected quantity of buffers among the first buffer and the plurality of different buffers,
    wherein the outputs of the first buffer and the plurality of different buffers are commonly coupled to provide the controlled slew rate output signal.

15. The non-transitory, computer-readable storage medium of claim 14, wherein the measured indication of the first impedance is determined by measuring the first impedance of one of the plurality of different buffers.

16. A constant impedance driver having an output for driving a controlled slew rate output signal from an integrated circuit, the constant impedance driver comprising:
    means for delaying an input signal to produce a first plurality of delayed signals each delayed differently with respect to the input signal;
    means for selecting signals from the first plurality of delayed signals;
    means for determining a measured indication of a first impedance;
    means for selecting a quantity of buffers to enable among the plurality of buffers in proportion to the measured indication of the first impedance; and
    means for buffering the selected signals and an non-delayed input signal, the means for buffering driving an output with the first impedance and the outputs of the means for buffering commonly coupled to provide the controlled slew rate output signal.

17. The constant impedance driver of claim 16, wherein the means for delaying an input signal is a delay circuit.

18. The constant impedance driver of claim 16, wherein the means for selecting signals is a selection circuit.

19. The constant impedance driver of claim 16, wherein the means for buffering the selected signals is a plurality of buffers.

20. The constant impedance driver of claim 16, wherein the means for determining the measured indication of the first impedance comprises calibration circuitry configured to measure the impedance of a scaled replica of the plurality of buffers.

* * * * *